(12) United States Patent
Kim et al.

(10) Patent No.: US 7,592,749 B2
(45) Date of Patent: Sep. 22, 2009

(54) PLASMA DISPLAY DEVICE

(75) Inventors: Dong-Hwan Kim, Chunan-si (KR); Joong-Ha Ahn, Chunan-si (KR); Sok-San Kim, Chunan-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 396 days.

(21) Appl. No.: 11/361,956

(22) Filed: Feb. 27, 2006

(65) Prior Publication Data
US 2006/0192730 A1    Aug. 31, 2006

(30) Foreign Application Priority Data
Feb. 25, 2005  (KR) ............... 10-2005-0015803
Feb. 25, 2005  (KR) ............... 10-2005-0015804

(51) Int. Cl.
*H01J 17/49* (2006.01)
(52) U.S. Cl. ............................................ 313/582
(58) Field of Classification Search ........... 313/582; 439/160
See application file for complete search history.

(56) References Cited

U.S. PATENT DOCUMENTS

| 4,422,728 | A | 12/1983 | Andreaggi |
| 6,560,124 | B1 | 5/2003 | Irie et al. |
| 7,414,204 | B2 | 8/2008 | Ahn et al. |
| 2003/0169573 | A1 | 9/2003 | Irie et al. |
| 2006/0160387 | A1* | 7/2006 | Kim et al. ............ 439/160 |

FOREIGN PATENT DOCUMENTS

| CN | 1 324 474 A | 11/2001 |
| CN | 1 612 679 A | 5/2005 |
| JP | 07-269537 A | 10/1995 |
| JP | 2003-043944 A | 2/2003 |

\* cited by examiner

*Primary Examiner*—Vip Patel
(74) *Attorney, Agent, or Firm*—Lee & Morse, P.C.

(57) ABSTRACT

A plasma display device including a plasma display panel, a chassis base having a first surface adjacent to which the plasma display panel is attached, a boss mounted in the chassis base, and a printed circuit board assembly that is supported by the boss and disposed adjacent to a second surface of the chassis base opposite to the first surface, wherein the boss includes a pressing groove, a portion of the chassis base is fitted into the pressing groove by pressing the boss and the chassis base together, and a front inner surface of the pressing groove has a slope, so as not to be parallel with a centerline of the boss.

22 Claims, 12 Drawing Sheets

PLASMA DISPLAY DEVICE

BACKGROUND OF THE INVENTION

1. Technical Field

The present invention relates to a plasma display device. More particularly, the present invention relates to a plasma display device including a chassis base having a boss that exhibits an enhanced fastening strength. The boss may be used to securely mount a printed circuit board assembly to the chassis base.

2. Related Art

In general, a plasma display device includes a plasma display panel that displays a visible image. The plasma display panel operates by exciting phosphors using vacuum ultraviolet light generated through gas discharge in a discharge cell. Plasma display devices may exhibit a number of desirable characteristics, such as excellent display capacity, brightness, contrast, viewing angle, etc.

The plasma display device may include the plasma display panel for displaying the visible image, as well as a chassis base for supporting the plasma display panel, printed circuit board assemblies mounted to a surface of the chassis base opposite to the plasma display panel, and a case for enclosing the plasma display panel, the chassis base and the printed circuit board assemblies, i.e., defining exterior surfaces of the plasma display device.

The case may include a front cover, located at the front side of the plasma display panel, and a rear cover, located at the rear side of the plasma display panel. Typically, the front and rear covers may be reversibly assembled and disassembled from each other.

The printed circuit board assemblies mounted to the chassis base may include one or more of the following: a power supply board assembly, an image processing board assembly, a logic board assembly, an address buffer board assembly, a sustain electrode driving board assembly, and a scan electrode driving board assembly. These printed circuit board assemblies may be formed by mounting components and elements on printed circuit boards according to predetermined designs.

The chassis base may include a plurality of mounting bosses, and the printed circuit board assemblies may fastened to the bosses by fasteners, e.g., screws. The printed circuit board assemblies may be electrically connected to the plasma display panel, e.g., by flexible printed circuits, to drive the plasma display panel.

The mounting boss may have a circular cross-section and may include a fastening part to which the fastener, e.g., a screw, is fastened. The boss may also include a pressing part which is integrally formed at the rear end of the fastening part. The pressing part of the boss may be pressed into the chassis base. The boss may further include a pressing groove formed in the boss between the fastening part and the pressing part. The pressing groove may be formed in a circumferential direction, i.e., around the boss. Upon installation of the boss into the chassis base, a portion of the chassis base may be formed into the pressing groove from the action of pressing the boss into the chassis base.

The chassis base may have the plasma display panel mounted to a front surface thereof, and the boss may be pressed through the chassis base from the front surface, in order to mount components to the opposing, i.e., rear, surface of the chassis base. The boss may be installed through a mounting hole formed in the chassis base in a location corresponding to the fastening position of a printed board assembly.

In detail, the boss may be installed through the mounting hole in the chassis base and the pressing part of the boss may be pressed into the front surface of the chassis base. Thus, a portion of the chassis base adjacent to the mounting hole and pressed by the pressing part may be deformed, i.e., the material of the chassis base may be displaced by the pressing of the pressing part into the chassis base. The deformation may cause the chassis base material to be displaced into the pressing groove. Thus, the portion of the chassis base adjacent to the mounting hole may be deformed with high density and may be fitted into the pressing groove of the boss to form a fitting part of the chassis base, interlocking with the boss and thereby fixing the boss in place in the chassis base.

Recently, in order to reduce the weight of plasma display devices, there has been a drive to reduce the thickness of the material used for the chassis base. However, reducing the thickness of the chassis base may limit the fastening strength of the boss, since it is fastened to the chassis base by being pressed into the material. In particular, the inner surface of the boss pressing groove is formed parallel to the center line of the boss, and the chassis base fitting portion is not completely fastened to the pressing groove. That is, a space may remain between the inner surface of the boss pressing groove and the chassis base fitting part after pressing the boss into the chassis base.

One result of this reduction in strength is that the boss may pull out or loosen. In particular, while the conventional structure may provide satisfactory strength against forces acting in the same direction as which the boss was pressed, forces acting in the direction opposite to the pressing direction may overcome the limited strength of the boss in this regard. For example, the contact resistance surface, formed where the chassis base fitting portion is deformed into the boss pressing groove, may be too narrow. Thus, while the boss may not be drawn out in the pressing direction, the resistance to separation in the opposite direction may be poor, such that a desired fastening strength cannot be obtained.

SUMMARY OF THE INVENTION

The present invention is therefore directed to a plasma display device, which substantially overcomes one or more of the problems due to the limitations and disadvantages of the related art.

It is therefore a feature of an embodiment of the present invention to provide a plasma display device having a boss for mounting components such as printed circuit board assemblies, wherein the boss may be pressed into a chassis base. An inner surface of a pressing groove of the boss may be shaped so as to reduce or eliminate any void remaining between the inner surface of the boss and a fitting part of the chassis base.

It is therefore another feature of an embodiment of the present invention to provide a plasma display device having a fastening member provided on a boss and disposed on a side of the chassis base opposite the side from which the boss is pressed.

At least one of the above and other features and advantages of the present invention may be realized by providing a plasma display device including a plasma display panel, a chassis base having a first surface adjacent to which the plasma display panel is attached, a boss mounted in the chassis base, and a printed circuit board assembly that is supported by the boss and disposed adjacent to a second surface of the chassis base opposite to the first surface, wherein the boss includes a pressing groove, a portion of the chassis base is fitted into the pressing groove by pressing the boss and the chassis base together, and a front inner surface of the pressing groove has a slope, so as not to be parallel with a centerline of the boss.

The boss may further includes a fastening part having a circular cross-section, and a pressing part integrally formed in the boss, wherein the pressing groove may be disposed between the fastening part and the pressing part and may extend around a circumference of the boss.

A maximum width of the pressing groove may be less than or equal to about ½ of a thickness of the chassis base adjacent to the boss, and a thickness of the pressing part may be less than or equal to about ⅓ of the thickness of the chassis base adjacent to the boss. A rear surface of the pressing groove may be substantially perpendicular to the centerline.

Substantially all of the front inner surface may be sloped, such that the sloped surface meets the rear surface of the pressing groove. The front inner surface may be a compound surface, such that a first part of the front inner surface is sloped and a second part of the front inner surface is substantially parallel to the centerline, and the second part of the front inner surface meets the rear surface of the pressing groove.

The sloped inner surface may be a straight section sloped at an angle α with respect to the centerline. The sloped inner surface may be a rounded surface. The rounded surface may extend from an outer rear end of a fastening part of the boss to intersect a rear of the pressing groove at a point coplanar with a pressing part of the boss. A shape of the sloped inner surface may correspond to a shape of the portion of the chassis base fitted into the pressing groove. The plasma display device may further include a fastening member, the fastening member fastened to the boss and having a contact resistance surface corresponding to the second surface of the chassis base.

At least one of the above and other features and advantages of the present invention may be realized by providing a plasma display device including a plasma display panel, a chassis base having a first surface adjacent to which the plasma display panel is attached, a boss mounted in the chassis base, a printed circuit board assembly that is supported by the boss, and a fastening member, the fastening member fastened to the boss and having a contact resistance surface corresponding to a second surface of the chassis base opposite to the first surface.

The fastening member may be threaded onto the boss. The fastening member may be a nut. An external surface of the nut may be circular. The contact resistance surface may be highly finished.

The boss may include a fastening part having a circular cross-section and having fastening grooves on an external surface, a pressing part integrally formed in the boss, and a pressing groove disposed between the fastening part and the pressing part and extending around a circumference of the boss. The fastening grooves may be screw threads.

The fastening member may be sized so that the contact resistance surface has an area that is less than that of a pressing surface of a pressing part of the boss. An inner surface of a pressing groove in the boss may be sloped so as not to be parallel with a centerline of the boss.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Korean Patent Application Nos. 10-2005-0015803 and 10-2005-0015804, filed on Feb. 25, 2005, in the Korean Intellectual Property Office and entitled "Plasma Display Device," are incorporated by reference herein in their entirety.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the figures, the dimensions of layers and regions are exaggerated for clarity of illustration. Like reference numerals refer to like elements throughout.

In a plasma display device according to the present invention, a boss, for mounting components such as printed circuit board assemblies, may be pressed into a chassis base. The boss may include a pressing groove, and the process of pressing the boss into the chassis base may deform the chassis base so as to extrude a portion of the chassis base material into the pressing groove, forming an interlocking fitting part of the chassis base. An inner surface of the pressing groove may be shaped so as to reduce or eliminate any void remaining between the inner surface and the fitting part, i.e., the extruded material. Thus, the fastening strength of the boss to the chassis base may be enhanced.

A fastening member may be provided on the boss on a side of the chassis base opposite the side from which the boss is pressed. The fastening member may have a contact resistance surface corresponding to the mounting surface of the chassis base having the printed circuit board assembly mounted thereon, and thus the bidirectional fastening strength of the boss to the chassis base may be enhanced.

Figure 1:
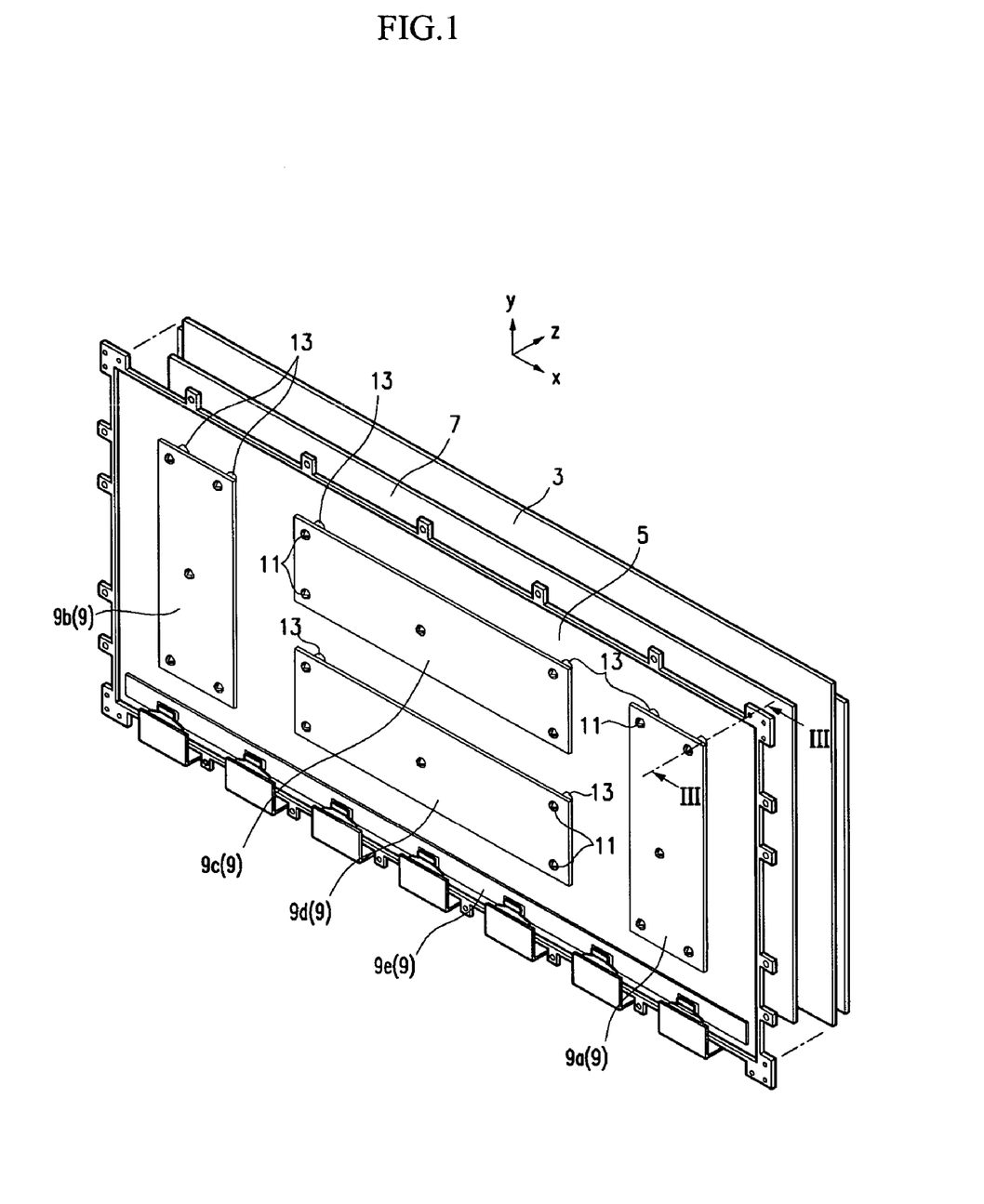
FIG. 1 illustrates an exploded perspective view of a plasma display device according to the present invention.
Figure 2:
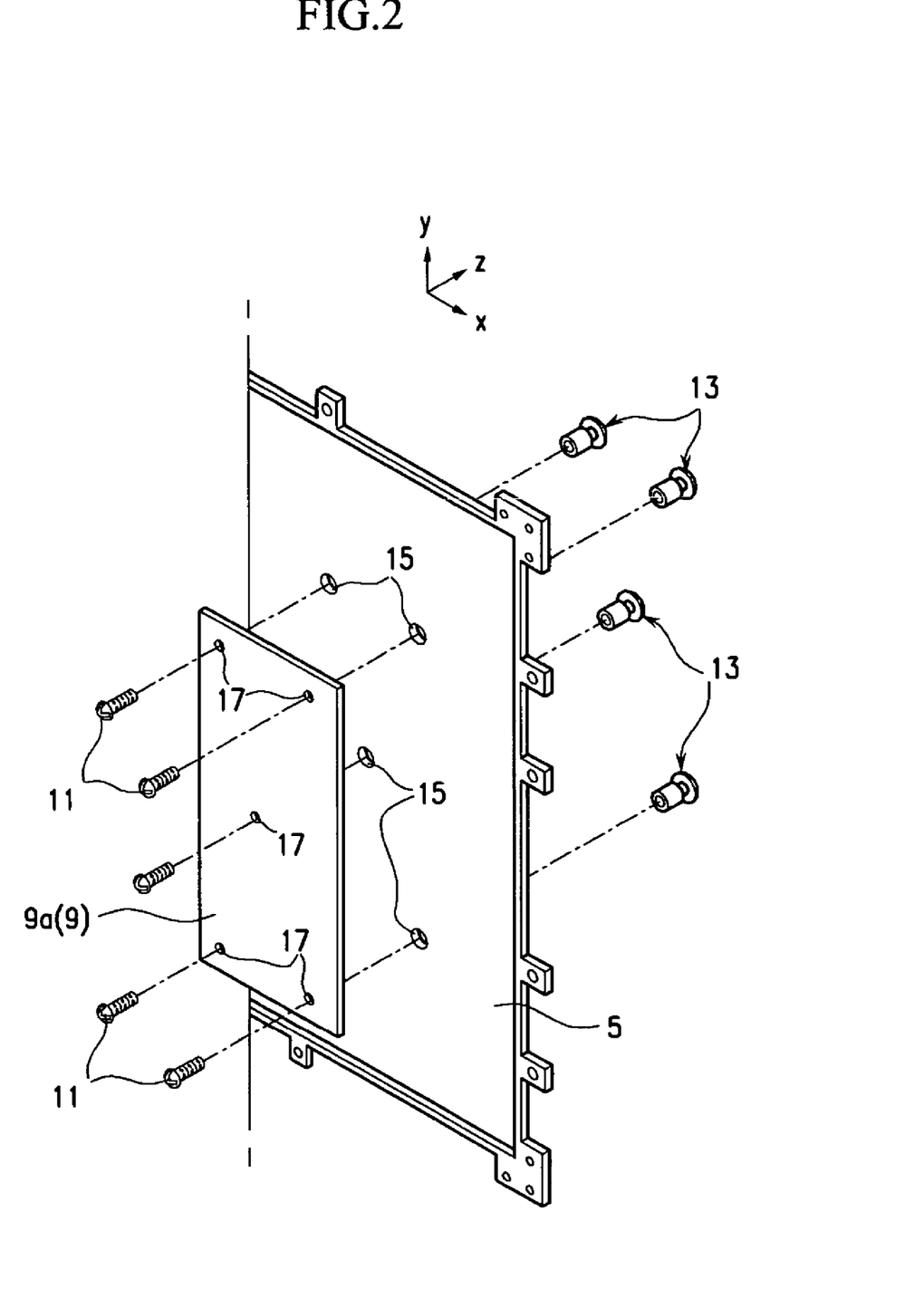
FIG. 2 illustrates an enlarged view of a portion of the plasma display device of FIG. 1.

FIG. 1 illustrates an exploded perspective view of a plasma display device according to the present invention, and FIG. 2 illustrates an enlarged view of a portion of the plasma display device of FIG. 1. Referring to FIGS. 1 and 2, the plasma display device will be schematically described.

The plasma display device according to the present invention may include a plasma display panel 3 for displaying a visible image. The plasma display panel 3 may be formed in a rectangular shape, having a larger dimension in the x-axis direction that in the y-axis direction.

The plasma display device may also include a chassis base 5, which may be disposed along one surface, i.e., the rear surface, of the plasma display panel 3, opposite to the surface where the image is displayed, and which may be coupled to the plasma display panel 3. The plasma display device may further include a front cover (not shown), disposed at the front surface of the plasma display panel 3, and a rear cover (not shown), disposed at the rear surface of the chassis base 5. A filter (not shown) for shielding electronic radiation emitted from the plasma display panel 3 may be mounted on the front cover. A heat sink sheet 7, for transferring heat generated by the plasma display panel 3 to the chassis base 5, may be disposed between the plasma display panel 3 and the chassis base 5.

The chassis base 5 may have a shape corresponding to the shape of the plasma display panel 3 and may be made of, e.g., a metal such as aluminum (Al) having excellent heat conductive characteristics. The plasma display panel 3 may be attached to, and supported by, one side, i.e., the front side, of the chassis base 5. A plurality of printed circuit board assemblies 9 for driving the plasma display panel 3 may be mounted on the other side of the chassis base 5.

The printed circuit board assemblies 9 may be mounted to the chassis base 5 by way of one or more bosses 13 protruding from the rear surface of the chassis base 5. Fasteners 11, e.g., screws, may pass through fastening holes 17 in the printed circuit board assemblies.

The printed circuit board assemblies 9 may include, e.g., a sustain electrode driving board assembly 9a, a scan electrode driving board assembly 9b, a switching mode power supply board assembly 9c, an image processing board assembly 9d, and an address buffer board assembly 9e. These printed circuit board assemblies 9 may fixed to the bosses 13 mounted on the chassis base 5 using screws 11, and may be electrically connected to the plasma display panel 3 by one or more flexible printed circuits (not shown) to drive the plasma display panel 3.

Figure 3:
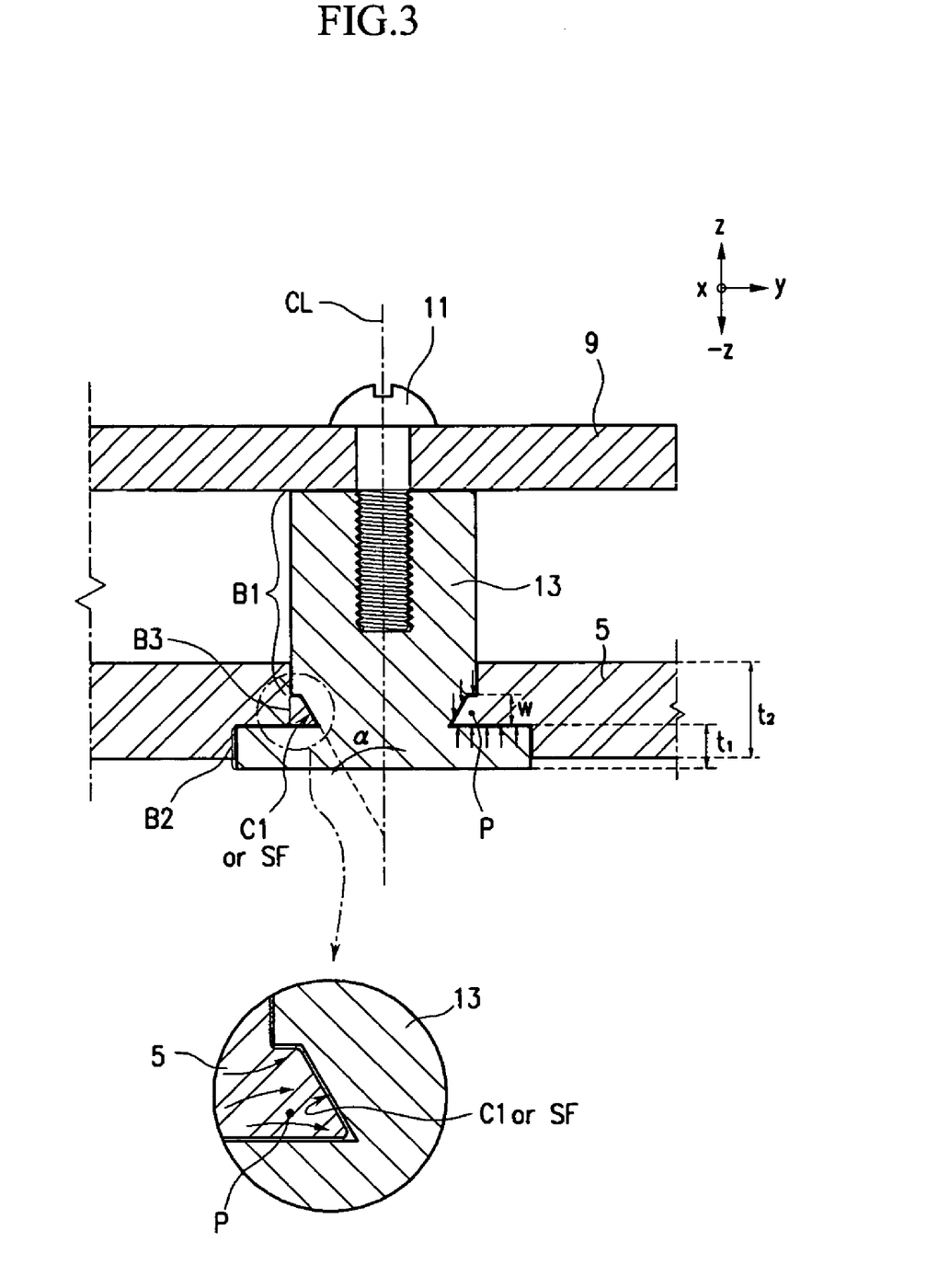
FIG. 3 illustrates a cross-sectional view according to a first embodiment of the present invention, corresponding to the line III-III of FIG. 1.
Figure 4A:
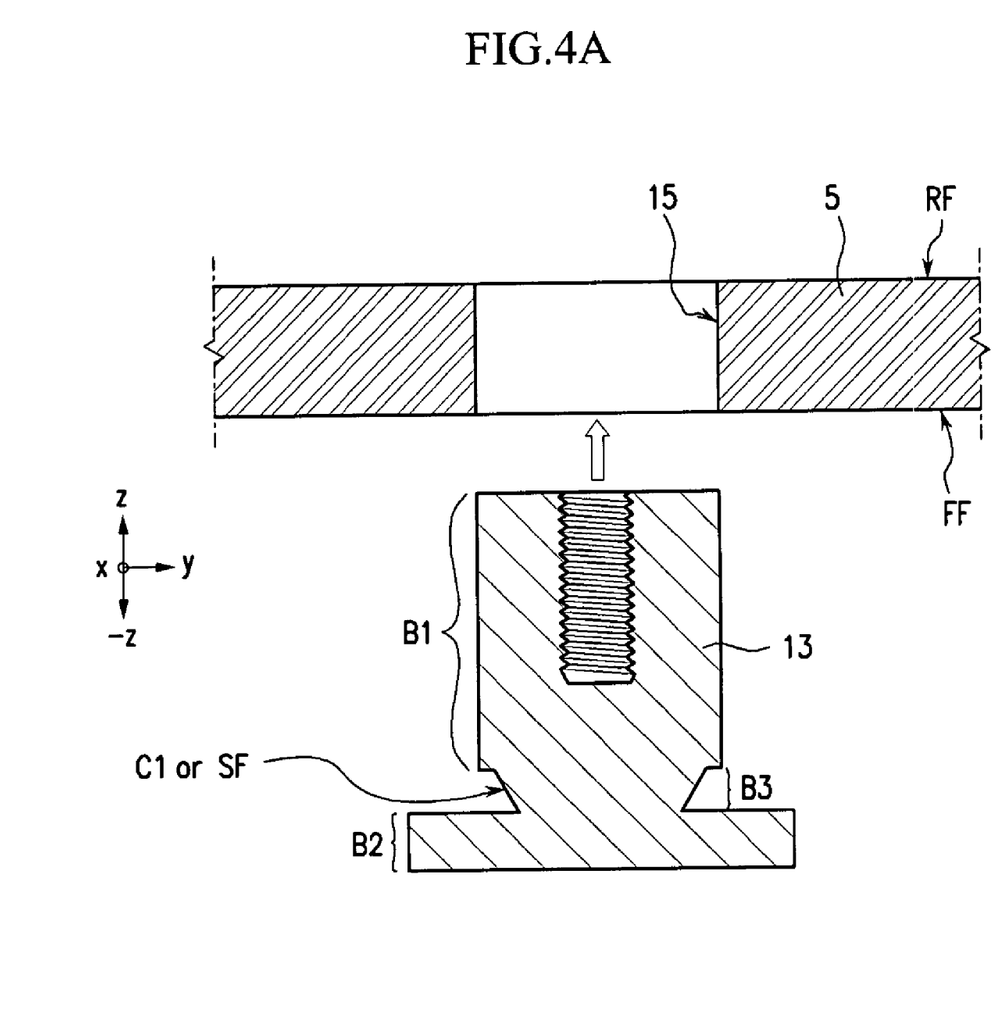
FIGS. 4A to 4C illustrate cross-sectional views of stages in a process of pressing a boss according to the first embodiment of the present invention.
Figure 4B:
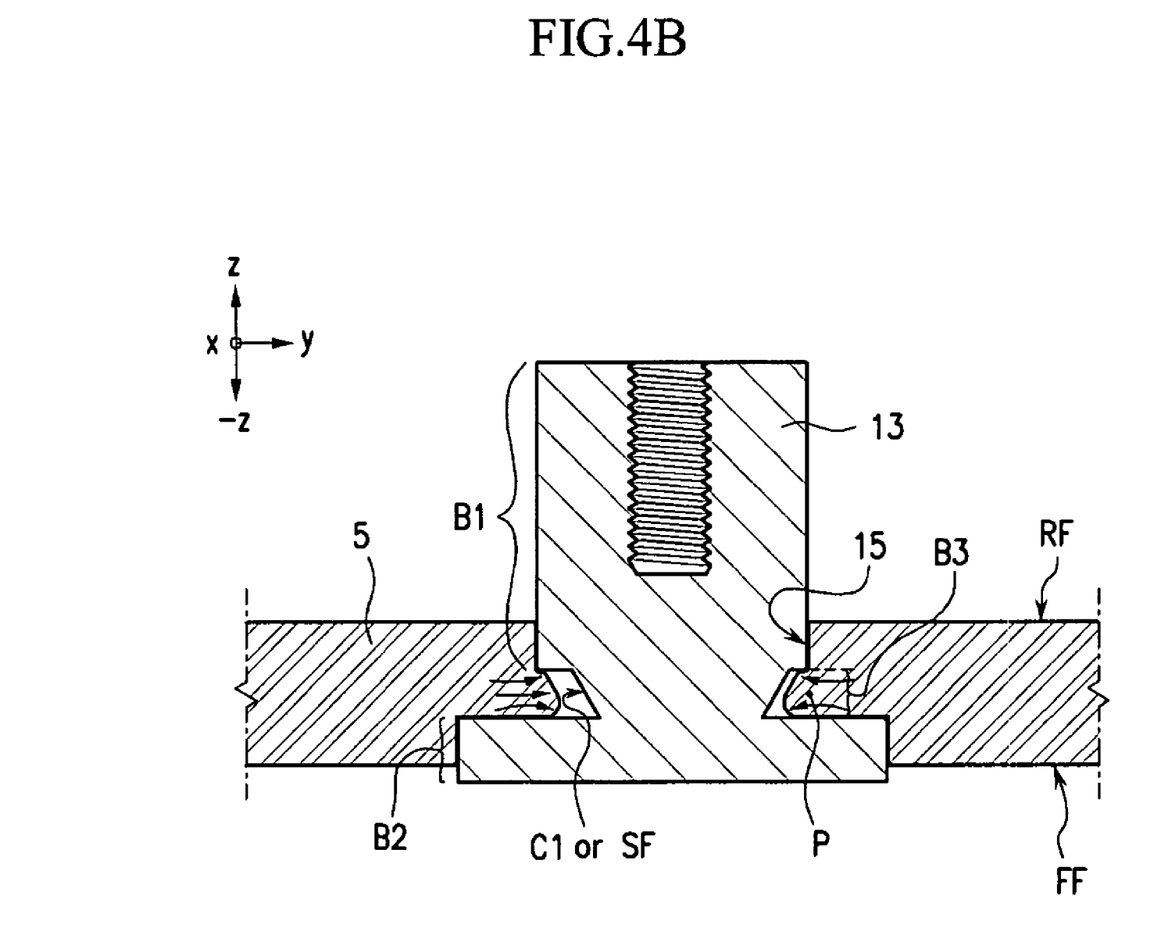
Figure 4C:
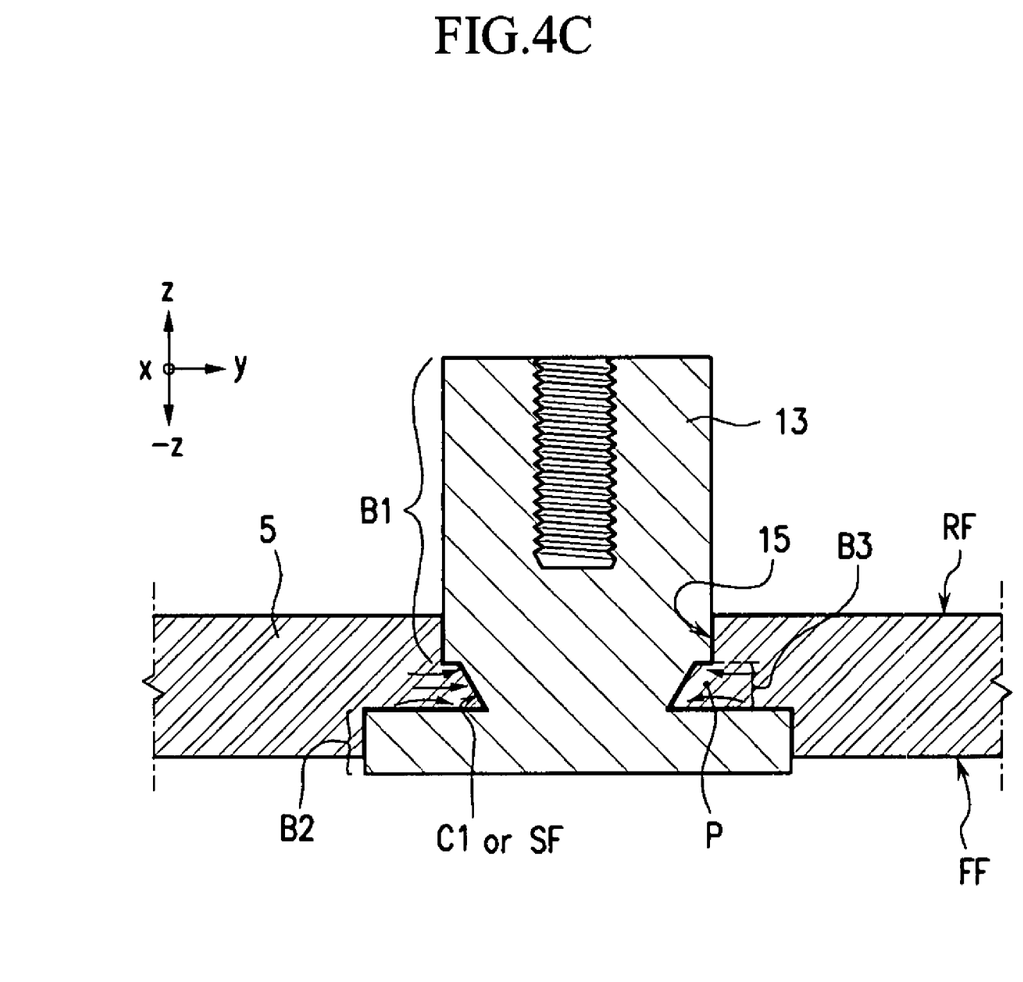
Figure 5:
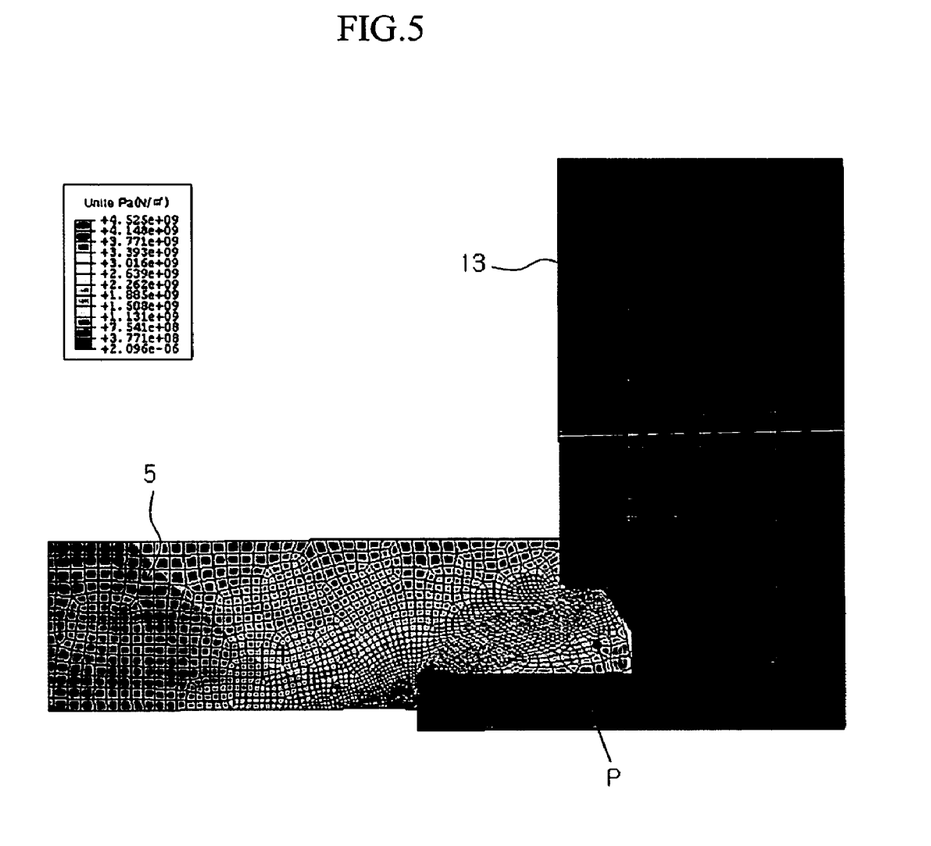
FIG. 5 illustrates analytical results of a simulation of pressing a boss according to the present invention.

FIG. 3 illustrates a cross-sectional view according to a first embodiment of the present invention, corresponding to the line III-III of FIG. 1, FIGS. 4A to 4C illustrate cross-sectional views of stages in a process of pressing a boss according to the first embodiment of the present invention, and FIG. 5 illustrates analytical results of a simulation of pressing a boss according to the present invention. In particular, the structure of the boss, the fastening process and the simulation of pressing results according to the first embodiment of the present invention will be described with reference to FIGS. 3 to 5.

The boss 13 according to the first embodiment of the present invention may be considered as including a fastening part B1, a pressing part B2 and a pressing groove B3, as shown in FIG. 3. Note, however, that describing the boss 13 as including three parts does not mean that the boss 13 may not be monolithically formed as a single piece having the above-described parts.

Referring to FIG. 3, the fastening part B1 may have a circular cross-section, with reference to the x-axis plane. The fastening part B1 may have a predetermined length, allowing it to be fastened to the printed circuit board assembly 9 by the screw 11.

The rear end of the boss 13 may be integrally formed to have the pressing part B2. The pressing part B2 may have a circular, planar shape in the x-axis plane. The thickness $t_1$ of the pressing part may be less that the thickness $t_2$ of the chassis base 5. The thickness $t_1$ of the pressing part B2 may be less than or equal to about ⅓ of the thickness $t_2$ of the chassis base 5. The pressing part B2 may be pressed into the chassis base 5 upon assembly.

The pressing groove B3 may be formed in the boss 13 between the pressing part B2 and the fastening part B1. The pressing groove B3 may extend around the boss B3, i.e., it may extend around the circumference thereof. The width w of the pressing groove B3 may be less than or equal to about ½ of the thickness $t_2$ of the chassis base 5. Referring to the enlarged view illustrated at the bottom of FIG. 3, a portion P of the chassis base 13 may be deformed and fitted into the pressing groove B2 upon assembly. That is, the pressing of the chassis base 5 by the pressing part B2 may extrude chassis base material into the pressing groove B3, such that a high density fitting part P is formed of the chassis base 5. Accordingly, the pressing groove B3 may fix the boss 13 to the chassis base 15 by way of the interlock between the boss pressing groove B3 and the chassis base fitting part P.

An inner surface SF of the pressing groove B3 may be a sloped surface C1. The surface C1 may be sloped at a predetermined angle α, defined with respect to the centerline CL of the boss 13. That is, the surface C1 may have a truncated conical shape, where the centerline of the hypothetical cone corresponds to the centerline CL of the boss 13 and the sides of the cone are angled at the angle α. The slope angle of the surface C1 may be set to be similar to the shape of the fitting part P, which may be determined empirically from the fitting part P of the chassis base 5 after it is deformed into the pressing groove B3 by pressing the boss 13 into the chassis base 5.

Thus, the sloped surface C1 is facing the resultant direction (the zy direction in the drawing) of the pressing direction of the boss 13 and the fitting direction of the chassis base 5.

In the particular cross-section illustrated in FIG. 3, the surface C1 on the left side of the boss 13 is angled to extend parallel to a line extending from a (−y, z) point to a (y, −z) point (hereinafter referred to as the →zy direction). By being angled in this manner, the surface C1 is disposed to oppose any forces tending to push the boss 13 out of the chassis base 15, i.e., forces opposite those used to press the boss 13 into the chassis base 15.

Details of the process of pressing and fastening the boss 13 to the chassis base 5 according to the first embodiment of the present invention will now be described with reference to FIGS. 2, 4A, 4B and 4C. Referring to FIG. 4A, the fastening part B1 of the boss 13 may be inserted into a mounting hole 15 from the front-facing surface FF of the chassis base 5, to which the plasma display panel 3 is attached, to the rear-facing surface RF. The location of the mounting hole 15 may correspond to the fastening position of a printed circuit board assembly 9.

Referring to FIG. 4B, the pressing part B2 may be pressed into the front surface FF of the chassis base 5, with the fastening part B1 of the boss 13 passing through the mounting hole 15. A pressed portion of the chassis base 5 may be deformed with high density by the pressing part B2, and may be extruded so as to fit into the pressing groove B3 of the boss 13.

Referring to FIG. 4C, if the pressing part B2 of the boss 13 is entirely pressed into the chassis base 5, the portion of the chassis based deformed with high density may entirely fill the pressing groove B3 to form the fitting part P. That is, as illustrated, the boss 13 may be entirely pressed, so as to leave no space along the sloped surface C1 defining the inner surface SF of the pressing groove B3.

FIG. 5 illustrates analytical results of a simulation of pressing a boss according to the present invention. Referring to FIG. 5, in the fitting part P of the chassis base 5, the deformation with high density is large in a region adjacent to the pressing part B2, as shown in the simulation of the pressing result. Further, it is apparent that the region of the chassis base 5 farthest from the pressing part B2 is the least deformed.

As described above, the boss 13 according to the first embodiment may maintain its fastening strength with respect to the chassis base 5, even where the thickness $t_2$ of the chassis base 5 is reduced to about 1 mm in order to reduce the weight of the plasma display device. In particular, the strength of the boss 13-to-chassis base 5 connection in the direction opposite of the pressing direction may be enhanced, i.e., the strength against forces applied in the –z-axis direction in FIG. 3.

Figure 6:
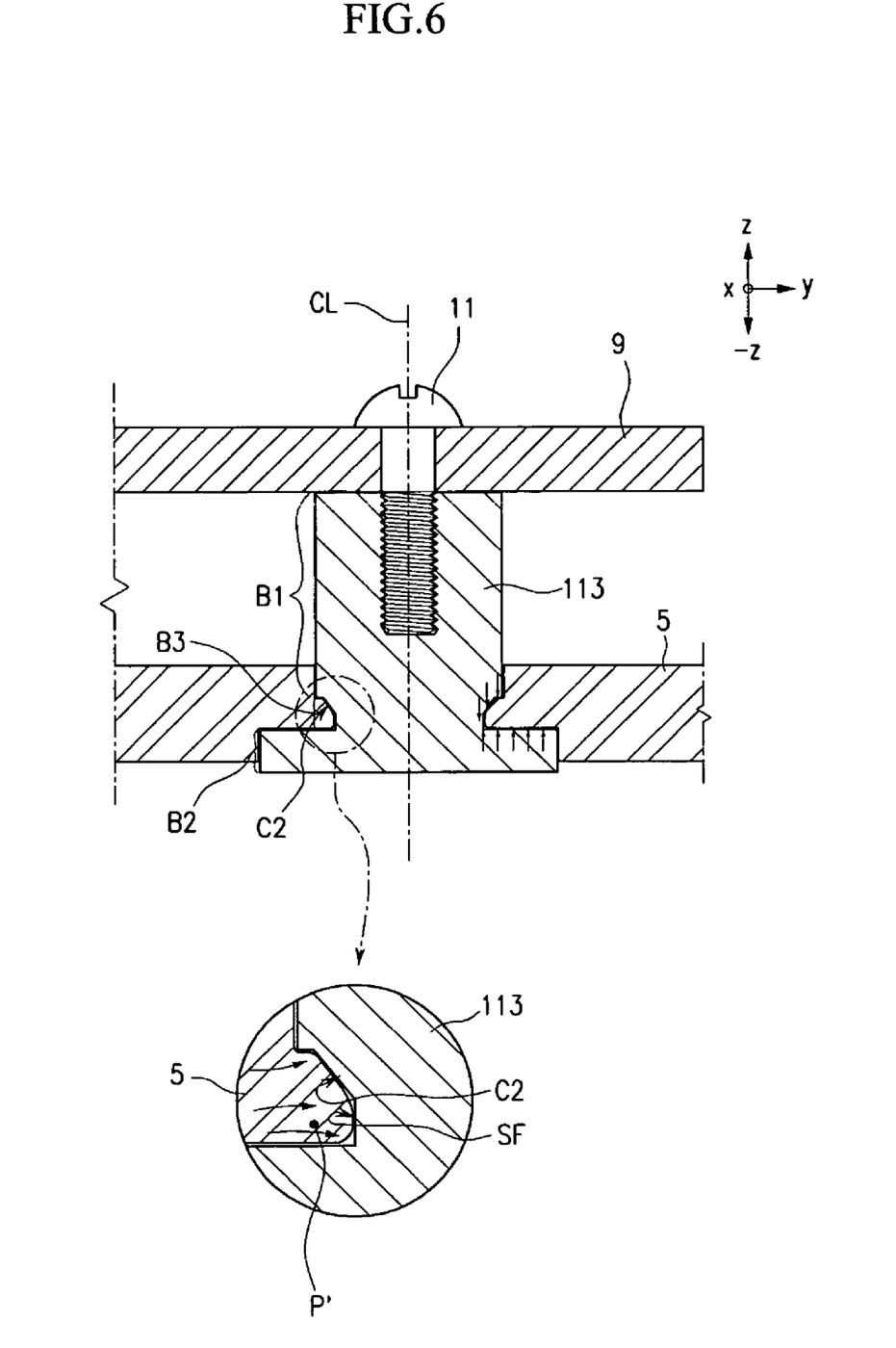
FIG. 6 illustrates a cross-sectional view according to a second embodiment of the present invention, corresponding to the line III-III of FIG. 1.

FIG. 6 illustrates a cross-sectional view according to a second embodiment of the present invention, corresponding to the line III-III of FIG. 1. The structure of the boss according to the second embodiment of the present invention will be described with reference to FIG. 6.

Referring to FIG. 6, the boss 113 according to the second embodiment of the present invention may include a fastening part B1, a pressing part B2 and a pressing groove B3, similar to the first embodiment of the present invention. The inner surface SF of the pressing groove B3 may have a sloped surface C2. The surface C2 may be sloped at a predetermined slope angle α' (not shown) with respect to the center line CL of the boss 113. The angle of the surface C2 may extend parallel to a line in the →zy direction in FIG. 6, in similar fashion to that described above with respect to the first embodiment. The angle α' may be equal to the angle α. The slope angle α' of the surface C2 may be set so that the pressing groove B3 has a shape corresponding to the fitting part P' of the chassis base 5 that is formed into the pressing groove B3 by the pressing process.

The pressing process for fastening the boss 13 to the chassis base 5, as well as the results of simulation of the pressing result, according to the second embodiment of the present invention may be similar to those described above in connection with the first embodiment.

In the second embodiment, the surface C2 may be formed only at an upper portion of the inner surface SF, whereas, in the first embodiment described above, the entire inner surface SF of the surface C1 may be sloped. In the second embodiment, the remaining portion of the inner surface SF may extend parallel to the centerline CL. That is, the inner surface SF of the pressing groove B3 according to the second embodiment of the present invention may be a compound surface including a plurality of surface elements, e.g., the surface C2 and a surface adjacent to the surface C2 and extending in parallel to the centerline CL.

Figure 7:
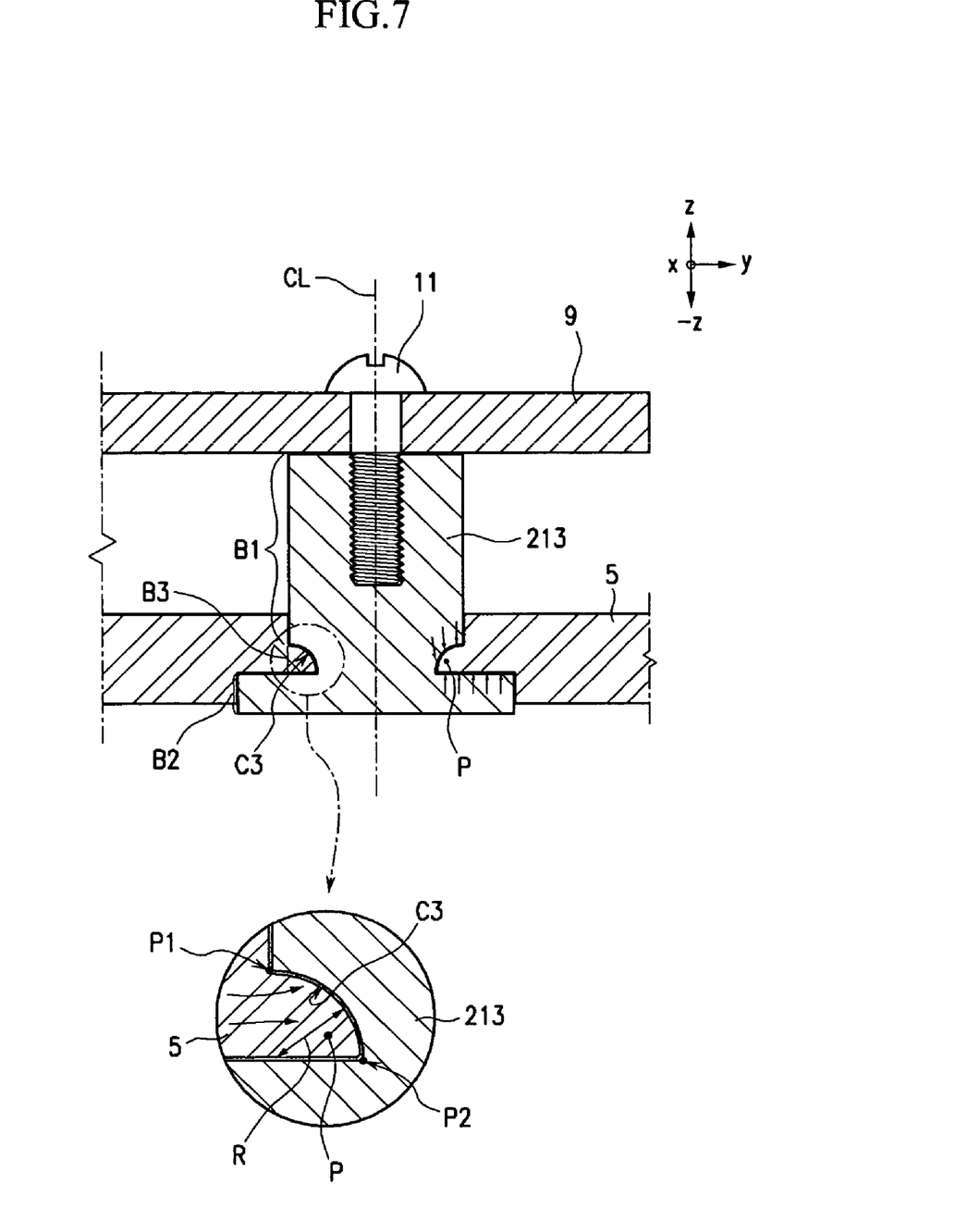
FIG. 7 illustrates a cross-sectional view according to a third embodiment of the present invention, corresponding to the line III-III of FIG. 1.

FIG. 7 illustrates a cross-sectional view according to a third embodiment of the present invention, corresponding to the line III-III of FIG. 1. The structure of the boss according to the third embodiment of the present invention will be described with reference to FIG. 7.

Referring to FIG. 7, the boss 213 according to the third embodiment of the present invention may include a fastening part B1, a pressing part B2 and a pressing groove B3, similar to the first embodiment of the present invention.

In the third embodiment, the inner surfaces SF of the pressing groove B3 may have a rounded surface C3. This shape may closely correspond to the shape of the fitting part P of the chassis base 5 formed upon pressing the boss 213 into the chassis base 5. Thus, the third embodiment of the present invention may differ from the first embodiment in that the curved inner surface SF of the pressing groove B3 according to the third embodiment may more closely correspond to the shape of the fitting part P.

That is, the surface C3 of the boss pressing groove B3 may be characterized in that the shape of the portion of the pressing groove B3 defined between an outer lower end P1 of the fastening part B1 and a point P2 at an inner edge of the pressing groove B3, where it contacts the pressing part B2, may be a rounded shape which is substantially similar to the fitting part P, thereby maximizing the contact area. The rounded shape may have predetermined shape corresponding to a section of a circle, an ellipse, a parabola, etc., or may be a shape determined empirically.

The process of pressing and fastening the boss 213 to the chassis base 5, and the results of the pressing simulation analysis, according to the third embodiment of the present invention may be similar to those described above with regards to the first and second embodiments. The fastening strength of connection between the boss 213 and the chassis base 5 may be further enhanced over that obtained according to the first and second embodiments.

Figure 8:
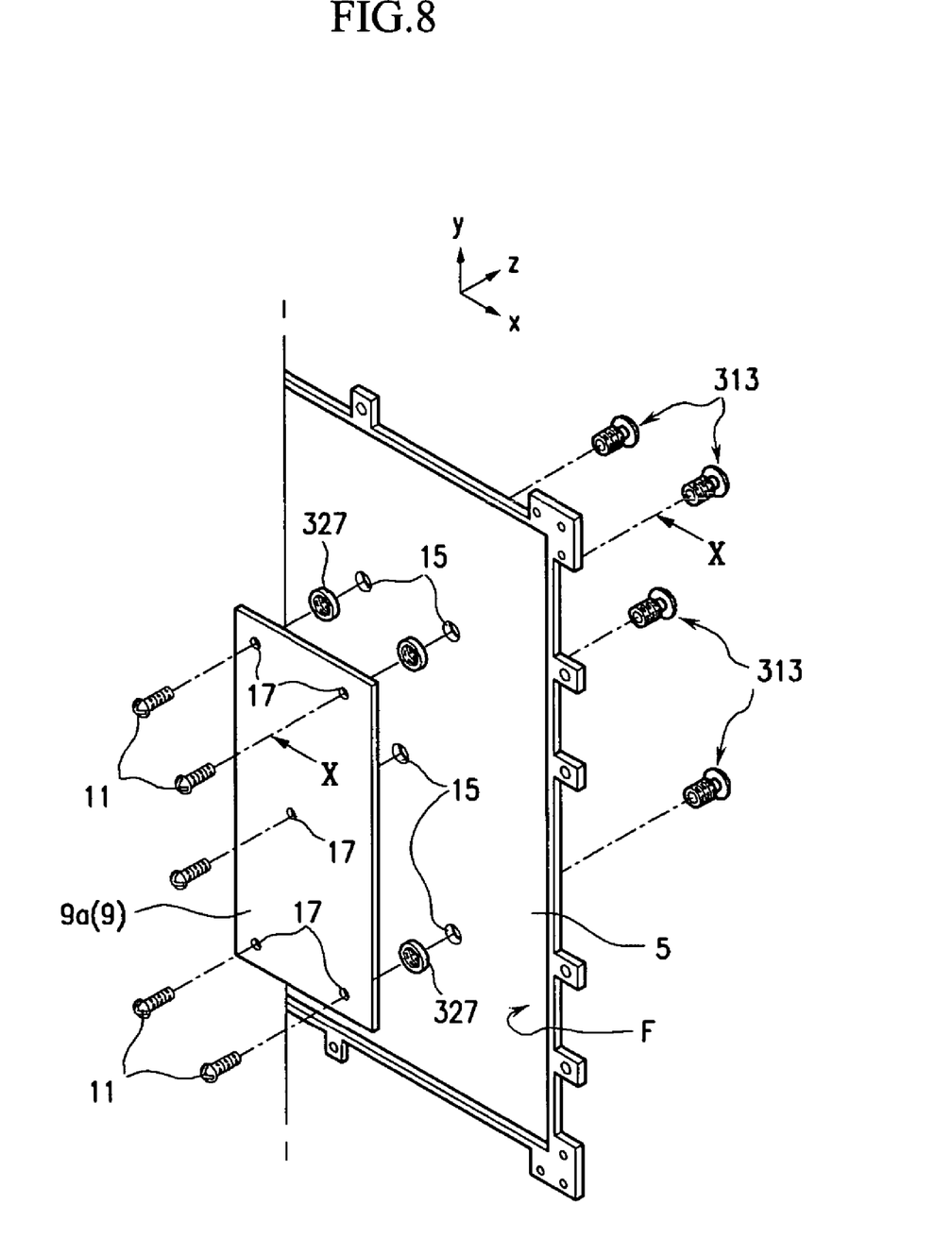
FIG. 8 illustrates a partial perspective view of a portion of a plasma display device according to a fourth embodiment of the present invention.
Figure 9:
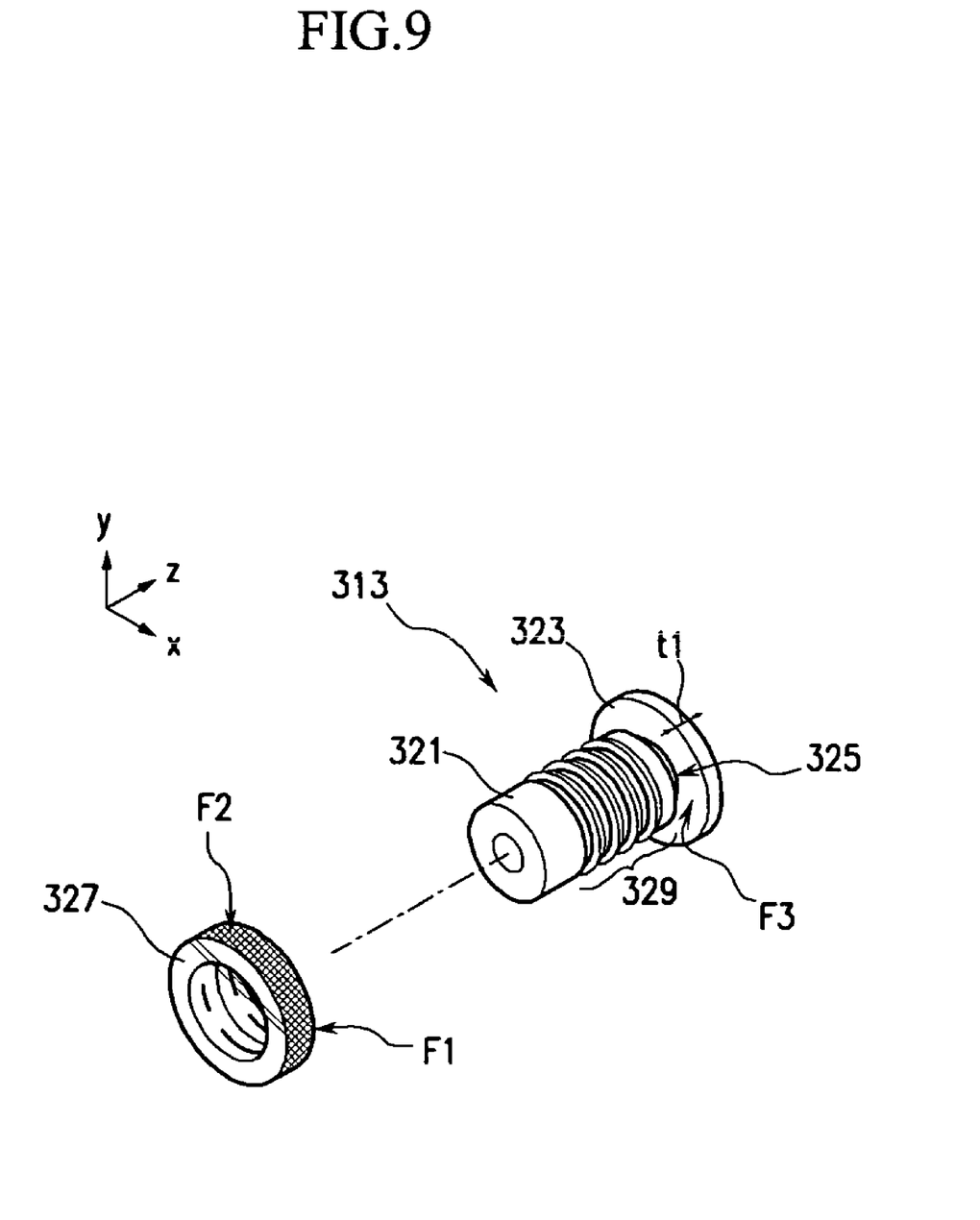
FIG. 9 illustrates a perspective view of a boss according to the fourth embodiment of the present invention.
Figure 10:
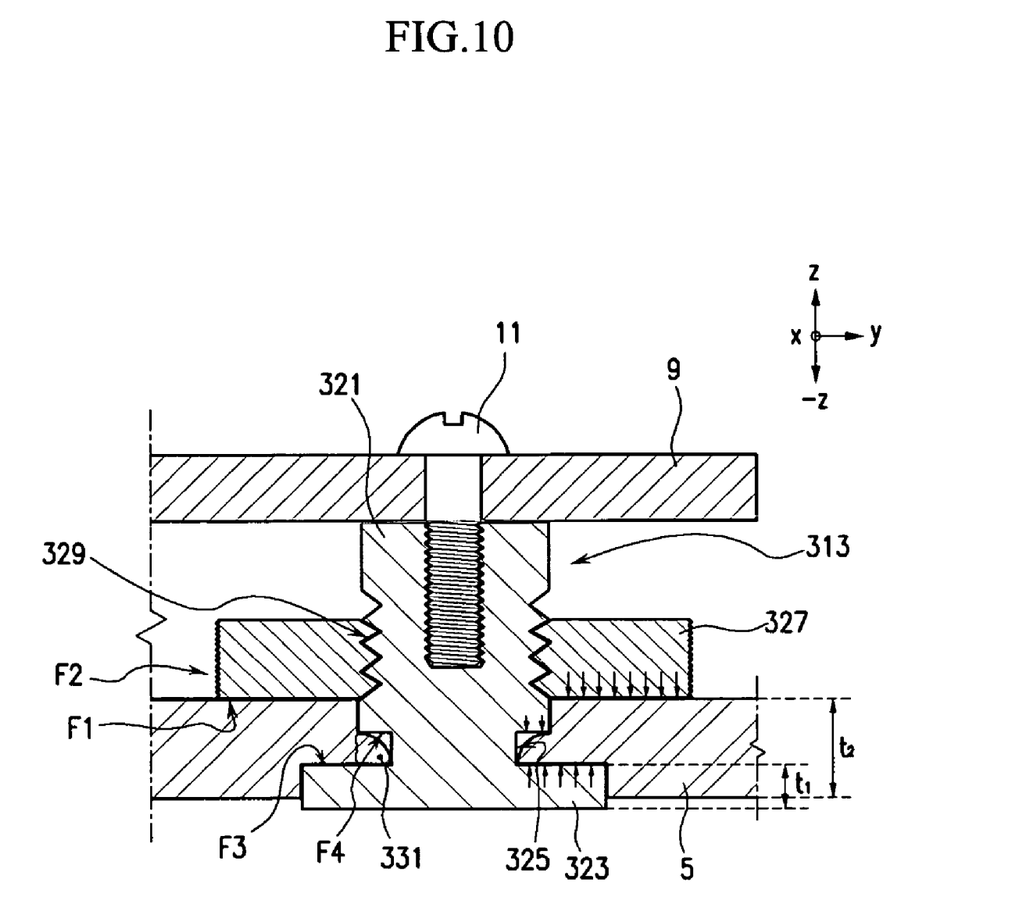
FIG. 10 illustrates a cross-sectional view of an assembled state of the plasma display device according to the fourth embodiment of the present invention, corresponding to the line X-X of FIG. 8.

FIG. 8 illustrates a partial perspective view of a portion of a plasma display device according to a fourth embodiment of the present invention, FIG. 9 illustrates a perspective view of a boss according to the fourth embodiment of the present invention, and FIG. 10 illustrates a cross-sectional view of an assembled state of the plasma display device according to the fourth embodiment of the present invention, corresponding to the line X-X of FIG. 8. The structure of the boss and the fastening method according to the fourth embodiment of the present invention will be described with reference to FIGS. 8-10.

Referring to FIG. 9, the boss 313 according to the fourth embodiment of the present invention may include a fastening part 321, a pressing part 323 and a pressing groove 325. Referring to FIG. 8, a fastening member 327, e.g., a nut, may be fastened to the boss 313. The nut 327 has a contact resistance surface F1, which is indicated by the small downward-pointing arrows along the lower right side of the nut 327. The contact resistance surface F1 corresponds to the mounting surface F of the chassis base 5.

The fastening part 321 of the boss may have a circular cross-section and may have fastening grooves 329 formed on the peripheral surface at predetermined intervals. The fastening grooves 329 may be, e.g., screw threads. The fastening part 321 may have a predetermined length and may contact the printed circuit board assembly 9 that is fastened to the chassis base 5. The screw 11 may thread inside the fastening part 321 to fix the printed circuit board assembly 9 in place.

The pressing part 323, which may be integrally formed at the rear end of the fastening part 321, may have a circular, planar shape and may have a thickness less than the thickness of the chassis base 5. Referring to FIG. 10, the thickness $t_1$ of the pressing part 323 may be less than or equal to about ⅓ of the thickness $t_2$ of the chassis base 5. The pressing part 323 may be pressed into the chassis base 5.

A pressing groove 325 may be formed around the circumference of the fastening part 321, between the pressing part 323 and the fastening part 321. The pressing groove 325 may function as described above for the other embodiments, i.e., it may fix the boss 313 to the chassis base 5 after the chassis base material is deformed into the pressing groove 325 through the process of pressing the pressing part 323 into the chassis base 5.

The nut 327 may be fastened to the fasting part 321 by being threaded onto the screw groove 329 such that the nut contact resistance surface F1 corresponds to the chassis base 5. The peripheral surface F2 of the nut 327 may be scratched, grooved, knurled, etc., to allow for manipulating the nut 327.

The shape of the nut 327 may be circular, such that the nut contact resistance surface F1 can be maximized while the contact surface is uniformly distributed. The contact resistance surface F1 of the nut 327 may be subjected to a precise finishing process so as not to be scratched when in contact with the mounting surface F of the chassis base 5. The nut 327 may be made of the same material as the chassis base 5, e.g., aluminum, or may be made of the same material as the boss 313.

As illustrated in FIG. 10, a surface of the pressing groove 325 constitutes a contact resistance surface F4, as indicated by two small downward-pointing arrows along the upper right surface of the pressing groove 325. Also, a surface of the pressing part 323 opposing the chassis base 5 constitutes a pressing surface F3, as indicated by the small-upward pointing arrows along the upper right side of the pressing part 323. In some implementations, the area of the contact resistance surface F1 may be less than that of the pressing surface F3 together with the contact resistance surface F4, in order to maintain the balance of the fastening strength with respect to the pressing direction (z-axis direction in the drawing) and the opposite direction (−z-axis direction).

The process of fastening the printed circuit board assembly using a boss according to the fourth embodiment will be described with reference to FIGS. 9 and 10. Referring to FIG. 10, the boss 313 may be fastened to the chassis base 5 by being pressed into a mounting hole 15 that is formed in the chassis base 5. The boss 313 may be pressed in from the front surface of the chassis base 5, i.e., from the surface where the plasma display panel 3 is to be attached. The boss 313 may extend out the rear surface, and may be positioned to correspond to the printed circuit board assembly 9. That is, the pressing part 323 of the boss 313 may be pressed into the front surface of the chassis base 5, while the fastening part 321 passes through the mounting hole 15. A portion of the chassis base 5 pressed by the pressing part 323 may be deformed into the pressing groove 325 to form a fitting part 331, thus fixing the boss 313 to the chassis base 5.

The nut 327 may be screwed onto the fixing grooves 329 of the fastening part 321 protruding from the mounting surface F of the chassis base 5, such that the mounting surface F of the chassis base 5, adjacent to which the printed circuit board assembly 9 is mounted, corresponds to the contact resistance surface F1 of the nut 327.

In some implementations, the relative areas of surfaces F1, F3 and F4 may be adjusted so as to balance the fastening strength of the boss in both directions, i.e., in the z, or pressing, direction, and in the −z, or pull-out, direction. For example, the difference between the area of the pressing surface F3 and the combined areas of the contact resistance surfaces F1 and F4 of the nut 327 and the pressing groove 325, respectively, may be reduced to enhance the fastening strength for both directions and maintain the balance of the fastening strength of the boss.

The boss 313 according to this embodiment of the present invention may maintain its fastening strength to the chassis base 5, even where the thickness of the chassis base 5 is reduced to about 1 mm in order to reduce the weight of the plasma display device. The boss 313 according to this embodiment may also increase the fastening strength in the opposite direction of the pressing direction (−z-axis direction in the drawing), i.e., it may oppose forces that are applied to pull out or otherwise force the boss 313 out of the chassis base 5.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A plasma display device comprising:
   a plasma display panel;
   a chassis base having a first surface adjacent to which the plasma display panel is attached;
   a boss mounted in the chassis base; and
   a printed circuit board assembly that is supported by the boss and disposed adjacent to a second surface of the chassis base opposite to the first surface, wherein:
   the boss includes a pressing groove,
   a portion of the chassis base is fitted into the pressing groove by pressing the boss and the chassis base together, and
   a front inner surface of the pressing groove has a slope, so as not to be parallel with a centerline of the boss.

2. The plasma display device as claimed in claim 1, wherein the boss further includes:
   a fastening part having a circular cross-section; and
   a pressing part integrally formed in the boss, wherein the pressing groove is disposed between the fastening part and the pressing part and extends around a circumference of the boss.

3. The plasma display device as claimed in claim 2, wherein a maximum width of the pressing groove is less than or equal to about ½ of a thickness of the chassis base adjacent to the boss, and
   a thickness of the pressing part is less than or equal to about ⅓ of the thickness of the chassis base adjacent to the boss.

4. The plasma display device as claimed in claim 1, wherein a rear surface of the pressing groove is substantially perpendicular to the centerline.

5. The plasma display device as claimed in claim 4, wherein substantially all of the front inner surface is sloped, such that the sloped surface meets the rear surface of the pressing groove.

6. The plasma display device as claimed in claim 4, wherein the front inner surface is a compound surface, such that a first part of the front inner surface is sloped and a second part of the front inner surface is substantially parallel to the centerline, and
   the second part of the front inner surface meets the rear surface of the pressing groove.

7. The plasma display device as claimed in claim 1, wherein the sloped inner surface is a straight section sloped at an angle α with respect to the centerline.

8. The plasma display device as claimed in claim 1, wherein an angle α is formed by the centerline of the boss and the resultant direction caused by the pressing direction of the boss and the fitting direction of the chassis base.

9. The plasma display device as claimed in claim 1, wherein the sloped inner surface is a rounded surface.

10. The plasma display device as claimed in claim 9, wherein the rounded surface extends from an outer rear end of a fastening part of the boss to intersect a rear of the pressing groove at a point coplanar with a pressing part of the boss.

11. The plasma display device as claimed in claim 1, wherein a shape of the sloped inner surface corresponds to a shape of the portion of the chassis base fitted into the pressing groove.

12. The plasma display device as claimed in claim 1, further comprising a fastening member, the fastening member fastened to the boss and having a contact resistance surface corresponding to the second surface of the chassis base.

13. A plasma display device comprising:
   a plasma display panel;
   a chassis base having a first surface adjacent to which the plasma display panel is attached;
   a boss mounted in the chassis base;
   a printed circuit board assembly that is supported by the boss; and
   a fastening member, the fastening member fastened to the boss and having a contact resistance surface corresponding to a second surface of the chassis base opposite to the first surface.

14. The plasma display device as claimed in claim 13, wherein the fastening member is threaded onto the boss.

15. The plasma display device as claimed in claim 14, wherein the fastening member is a nut.

16. The plasma display device as claimed in claim 15, wherein an external surface of the nut is circular.

17. The plasma display device as claimed in claim 15, wherein the contact resistance surface is highly finished.

18. The plasma display device as claimed in claim 13, wherein the boss includes:
   a fastening part having a circular cross-section and having fastening grooves on an external surface;
   a pressing part integrally formed in the boss; and
   a pressing groove disposed between the fastening part and the pressing part and extending around a circumference of the boss.

19. The plasma display device as claimed in claim 18, wherein the fastening grooves are screw threads.

20. The plasma display device as claimed in claim 13, wherein the fastening member is sized so that the contact resistance surface has an area that is less than that of a pressing surface of a pressing part of the boss.

21. The plasma display device as claimed in claim 13, wherein an inner surface of a pressing groove in the boss is sloped so as not to be parallel with a centerline of the boss.

22. The plasma display device as claimed in claim 21, wherein, the inner surface of a pressing groove is sloped corresponding to the resultant direction of the pressing direction of the boss and the fitting direction of the chassis base.

* * * * *